(12) United States Patent
Nakamori

(10) Patent No.: US 8,455,338 B2
(45) Date of Patent: Jun. 4, 2013

(54) METHOD OF FORMING A SEMICONDUCTOR DEVICE INTRODUCING PLURAL IMPURITIES TO FORM PLURAL WELLS

(75) Inventor: Toshiya Nakamori, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 21 days.

(21) Appl. No.: 13/094,369

(22) Filed: Apr. 26, 2011

(65) Prior Publication Data

US 2012/0100702 A1    Apr. 26, 2012

(30) Foreign Application Priority Data

Apr. 27, 2010  (JP) ................... 2010-102109

(51) Int. Cl.
*H01L 21/20* (2006.01)
*H01L 21/36* (2006.01)

(52) U.S. Cl.
USPC .................... 438/492; 257/E21.63

(58) Field of Classification Search
USPC ............. 438/223, 532, 492; 257/E21.63
See application file for complete search history.

(56) References Cited

U.S. PATENT DOCUMENTS

| | | | | |
|---|---|---|---|---|
| 6,482,692 B2 * | 11/2002 | Kawasaki et al. | ............. | 438/218 |
| 6,548,383 B1 * | 4/2003 | Trivedi et al. | ................. | 438/532 |

FOREIGN PATENT DOCUMENTS

| | | |
|---|---|---|
| JP | 08-017946 | 1/1996 |
| JP | 08-316168 | 11/1996 |
| JP | 09-321233 | 12/1997 |
| JP | 2001-210801 | 8/2001 |
| JP | 2002-368126 | 12/2002 |
| JP | 2008-277320 | 11/2008 |

* cited by examiner

*Primary Examiner* — William D Coleman
(74) *Attorney, Agent, or Firm* — Young & Thompson

(57) ABSTRACT

A method for forming a semiconductor device includes the following processes. A first well including a memory cell region of a semiconductor substrate is formed. A second well including a first peripheral circuit region of the semiconductor substrate is formed after forming the first well.

17 Claims, 16 Drawing Sheets

METHOD OF FORMING A SEMICONDUCTOR DEVICE INTRODUCING PLURAL IMPURITIES TO FORM PLURAL WELLS

BACKGROUND OF THE INVENTION

1. Field of the Invention

The present invention relates to a method of forming a semiconductor device.

Priority is claimed on Japanese Patent Application No. 2010-102109, Apr. 27, 2010, the content of which is incorporated herein by reference.

2. Description of the Related Art

Japanese Unexamined Patent Application, First Publication, No. JP-A-2001-210801 discloses a field-effect transistor (FET). In the field-effect transistor, a groove is formed in a semiconductor substrate, a gate insulating film is formed in the groove, and a gate electrode is further buried in the groove. Japanese Unexamined Patent Applications, First Publications, Nos. JP-A-2008-277320, JP-A-2002-368126, JP-A-H08-17946, JP-A-H08-316168, and JP-A-H09-321233 disclose methods of forming planar transistors. Those five methods include a method of forming a well region.

SUMMARY

In one embodiment, a method of forming a semiconductor device may include, but is not limited to, the following processes. A first well including a memory cell region of a semiconductor substrate is formed. A second well including a first peripheral circuit region of the semiconductor substrate is formed after forming the first well.

In another embodiment, a method for forming a semiconductor device may include, but is not limited to, the following processes. A first impurity is introduced into a semiconductor substrate to form a first well in the semiconductor substrate. A semiconductor layer is formed over the semiconductor substrate. A second impurity is introduced into the semiconductor substrate using a first mask to form a second well in the semiconductor substrate. A third impurity is introduced into the semiconductor layer using the first mask to form a first impurity-introduced region in the semiconductor layer.

In still another embodiment, a method for forming a semiconductor device may include, but is not limited to, the following processes. A first impurity is introduced into a semiconductor substrate to form a first well including a memory cell region. A semiconductor layer is formed over the semiconductor substrate. A second impurity is introduced into the semiconductor substrate through the semiconductor layer using a first mask to form a second well including a first peripheral circuit region. The second well is adjacent to the first well. A third impurity is introduced into the semiconductor layer over the second well using the first mask to form the first impurity-introduced region.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail, in order to facilitate the understanding of the present invention.

An example of a method of forming an FET, in the related art, in which a gate electrode is buried in a semiconductor substrate will be described with reference to FIGS. 28 through 42.

Figure 28:
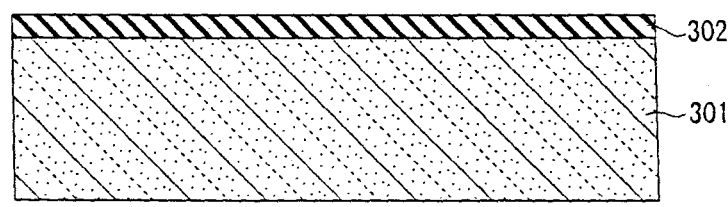
FIG. 28 is a fragmentary cross sectional elevation view illustrating a MOS transistor in a step involved in a method of forming a semiconductor device in the related art.

As shown in FIG. 28, a first silicon oxide film 302 is formed using a thermal oxidation method on a surface of a semiconductor substrate 301.

Figure 29:
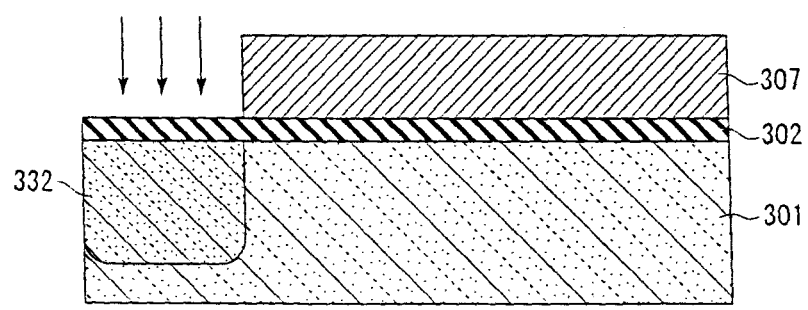
FIG. 29 is a fragmentary cross sectional elevation view illustrating the MOS transistor in a step, subsequent to the step of FIG. 28, involved in the method of forming the semiconductor device in the related art.

As shown in FIG. 29, a well layer 332 of a second conductivity type (e.g., an n-type) is formed in a peripheral circuit region E of the semiconductor substrate 301.

Specifically, a mask 307 for forming a well of the peripheral circuit region E is formed on the first silicon oxide film 302. A second dopant of the second conductivity type is implanted into the semiconductor substrate 301 by an ion implantation process, thereby forming the well layer 332 of the second conductivity type (e.g., the n-type).

Figure 30:
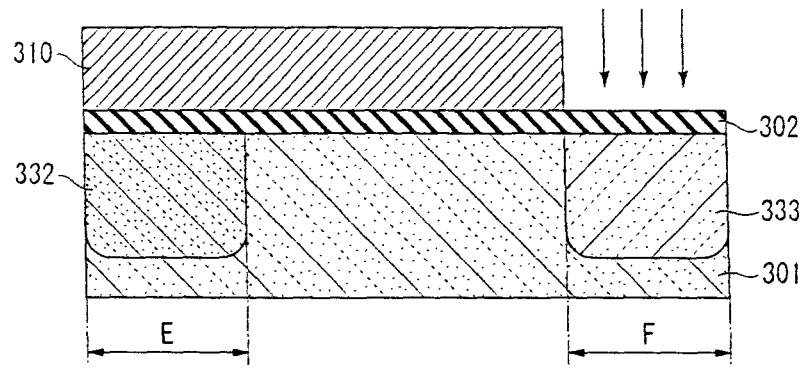
FIG. 30 is a fragmentary cross sectional elevation view illustrating the MOS transistor in a step, subsequent to the step of FIG. 29, involved in the method of forming the semiconductor device in the related art.

As shown in FIG. 30, a well layer 333 of a first conductivity type (e.g., a p-type) is formed in another peripheral circuit region F of the semiconductor substrate 301.

Specifically, after the mask 307 is removed, a mask 310 for forming a well of the peripheral circuit region F is formed on the first silicon oxide film 302. A first dopant of the first conductivity type are implanted into the semiconductor substrate 301 by an ion implantation process, thereby forming the well layer 333 of the first conductivity type (e.g., the p-type).

Figure 31:
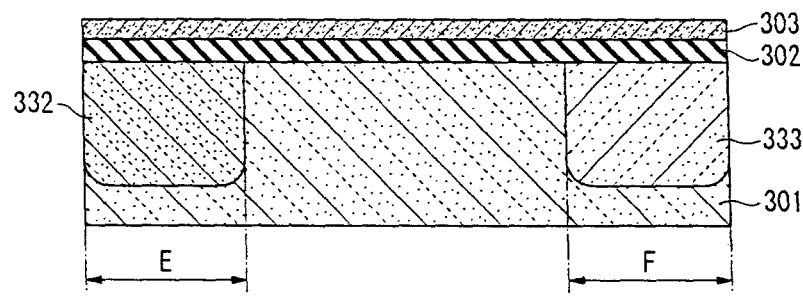
FIG. 31 is a fragmentary cross sectional elevation view illustrating the MOS transistor in a step, subsequent to the step of FIG. 30 involved in the method of forming the semiconductor device in the related art.

As shown in FIG. 31, after the mask 310 is removed, a first undoped polysilicon (poly-Si) film 303 containing no dopant is formed on the first silicon oxide film 302.

Figure 32:
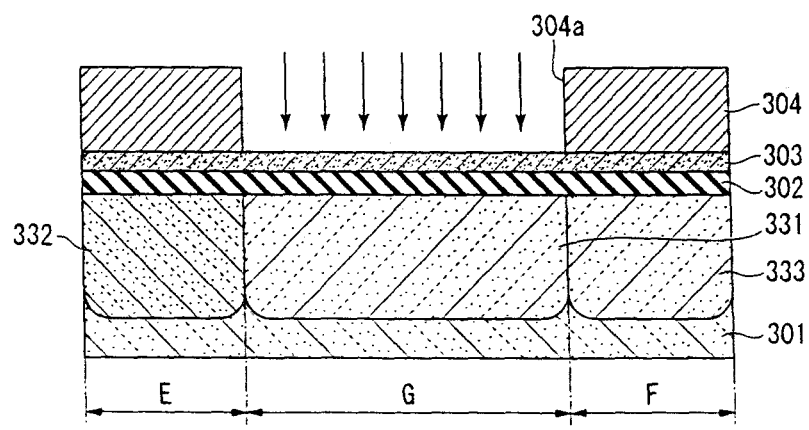
FIG. 32 is a fragmentary cross sectional elevation view illustrating the MOS transistor in a step, subsequent to the step of FIG. 31, involved in the method of forming the semiconductor device in the related art.

As shown in FIG. 32, a well layer 331 of the first conductivity type (e.g., the p-type) is formed on a memory cell region G of the semiconductor substrate 301.

Specifically, a mask 304 for forming a well of the memory cell region G is formed on the first undoped poly-Si film 303. A third dopant of the first conductivity type are implanted into the semiconductor substrate 301 using an ion implantation process via an opening 304a of the mask 304, thereby forming the well layer 331 of the first conductivity type (e.g., the p-type).

Figure 33:
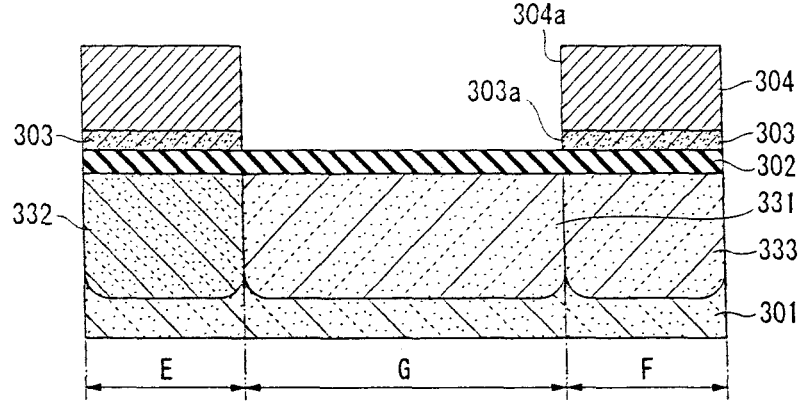
FIG. 33 is a fragmentary cross sectional elevation view illustrating the MOS transistor in a step, subsequent to the step of FIG. 32, involved in the method of forming the semiconductor device in the related art.

As shown in FIG. 33, the first undoped poly-Si film 303 disposed in the memory cell region G is removed by etching process using the mask 304 for forming the well as an etching mask. The first silicon oxide film 302 disposed in the memory cell region G is shown.

Figure 34:
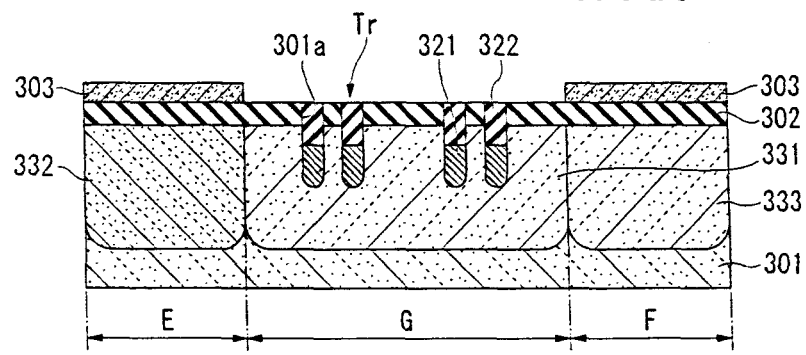
FIG. 34 is a fragmentary cross sectional elevation view illustrating the MOS transistor in a step, subsequent to the step of FIG. 33, involved in the method of forming the semiconductor device in the related art.

As shown in FIG. 34, a groove 301a for a gate electrode is formed in the well layer 331 and the first silicon oxide film 302 of the memory cell region G. A gate insulating film (not shown) is formed on an inner surface of the groove 301a by a thermal oxidation method. A gate electrode 321 formed of, for example, tungsten (W), is buried in the groove 301a. A second silicon oxide film 322 is formed on the gate electrode 321 to be buried in the groove 301a completely. A fourth dopant of the second conductivity type is implanted into portions of the well layer 331 of the first conductivity type which are disposed on both sides of the groove 301a, thereby forming impurity diffusion regions (not shown). The impurity diffusion regions become source and drain regions of an FET. In the above-described process, a transistor Tr including the gate electrode 321 buried in the semiconductor substrate 301 is formed.

Figure 35:
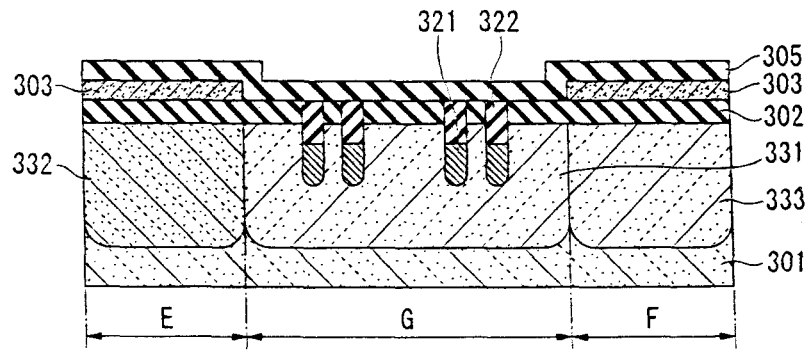
FIG. 35 is a fragmentary cross sectional elevation view illustrating the MOS transistor in a step, subsequent to the step of FIG. 34, involved in the method of forming the semiconductor device in the related art.

As shown in FIG. 35, a third silicon oxide film 305 is formed on an exposed portion of the first silicon oxide film 302 and the first undoped poly-Si film 303. The third silicon oxide film 305 is formed to cover the memory cell region G and the peripheral circuit regions E and F.

Figure 36:
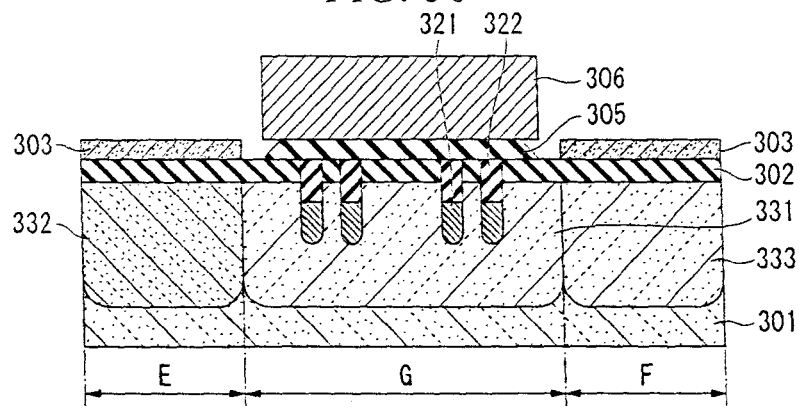
FIG. 36 is a fragmentary cross sectional elevation view illustrating the MOS transistor in a step, subsequent to the step of FIG. 35, involved in the method of forming the semiconductor device in the related art.

As shown in FIG. 36, an etch mask 306 is formed on the memory cell region G. The third silicon oxide film 305 is dry etched using the etch mask 306 as a mask, thereby removing the third silicon oxide film 305 from the peripheral circuit regions E and F.

Figure 37:
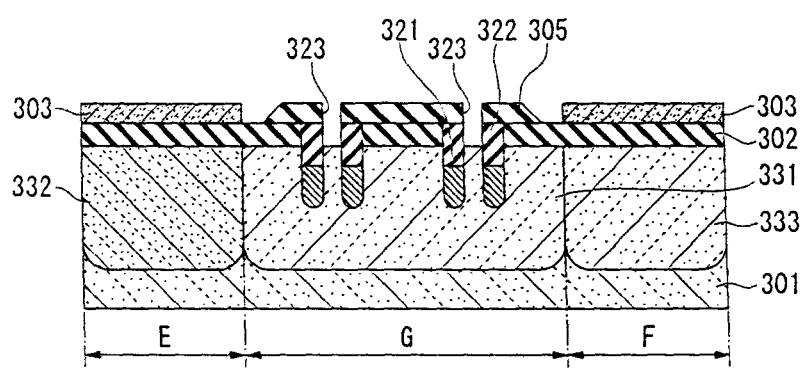
FIG. 37 is a fragmentary cross sectional elevation view illustrating the MOS transistor in a step, subsequent to the step of FIG. 36, involved in the method of forming the semiconductor device in the related art.

As shown in FIG. 37, bit contact holes 323 are provided in the third silicon oxide film 305 remaining in the memory cell region G. The semiconductor substrate 301 is shown through the bit contact holes 323.

Figure 38:
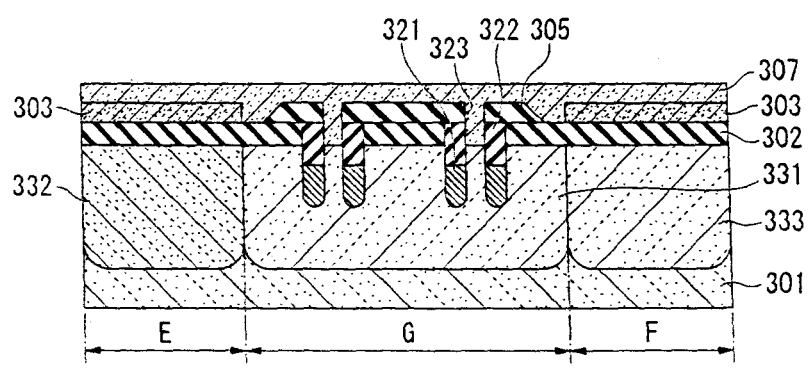
FIG. 38 is a fragmentary cross sectional elevation view illustrating the MOS transistor in a step, subsequent to the step of FIG. 37, involved in the method of forming the semiconductor device in the related art.

As shown in FIG. 38, a second undoped poly-Si film 307 containing no dopant is formed to be buried in the bit contact holes 323. The second undoped poly-Si film 307 covers the memory cell G and the peripheral circuit regions E and F. A surface of the second undoped poly-Si film 307 is preferably planarized.

Figure 39:
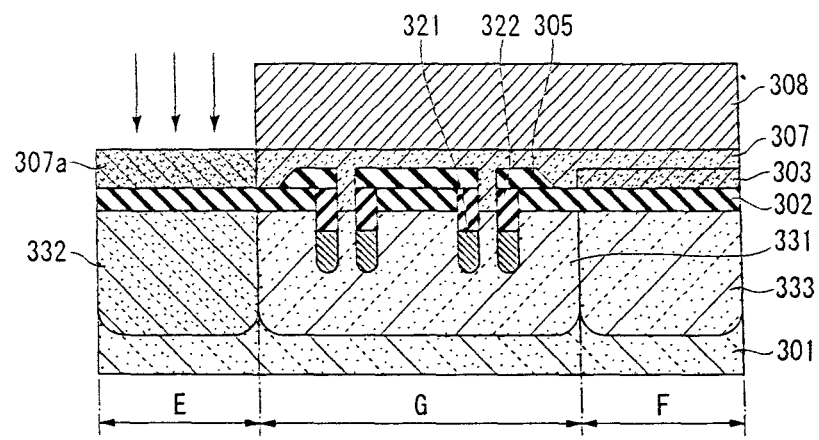
FIG. 39 is a fragmentary cross sectional elevation view illustrating the MOS transistor in a step, subsequent to the step of FIG. 38, involved in the method of forming the semiconductor device in the related art.

As shown in FIG. 39, a fifth dopant of the first conductivity type (e.g., the p type) is doped into the first and second undoped poly-Si films 303 and 307 disposed in the peripheral circuit region E.

Specifically, a mask 308 used for doping the fifth dopant into the peripheral circuit region E is formed on the second undoped poly-Si film 307. The fifth dopant of the first conductivity type is implanted into the first and second undoped poly-Si films 303 and 307 by an ion implantation process. Thus, a first doped poly-Si film 307a containing the fifth dopant of the first conductivity type is formed in the peripheral circuit region E.

Figure 40:
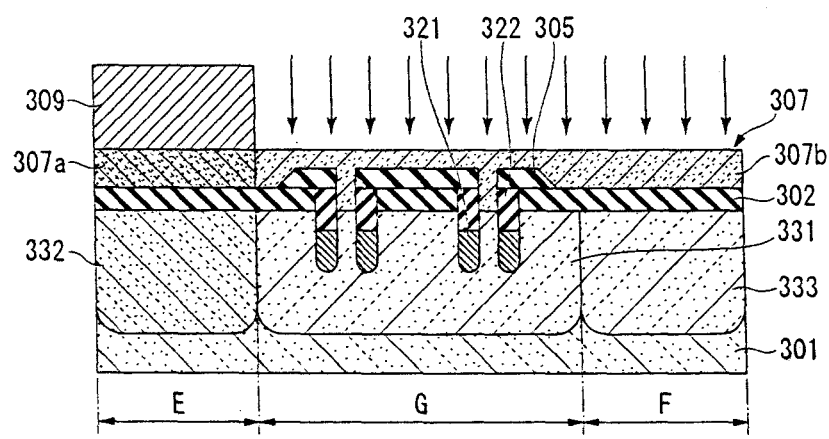
FIG. 40 is a fragmentary cross sectional elevation view illustrating the MOS transistor in a step, subsequent to the step of FIG. 39, involved in the method of forming the semiconductor device in the related art.

As shown in FIG. 40, a sixth dopant of the second conductivity type (e.g., the n type) is doped into the first and second undoped poly-Si films 303 and 307 in the memory cell region G and the peripheral circuit region F.

Specifically, a mask 309 used for doping the sixth dopant into the memory cell region G and the peripheral circuit region F is formed on the first doped poly-Si film 307a. The sixth dopant of the second conductivity type is implanted into the first and second undoped poly-Si films 303 and 307 by an ion implantation process. Thus, a second doped poly-Si film 307b containing the sixth dopant of the second conductivity type (e.g., the n type) is formed throughout the memory cell region G and the peripheral circuit region F.

Figure 41:
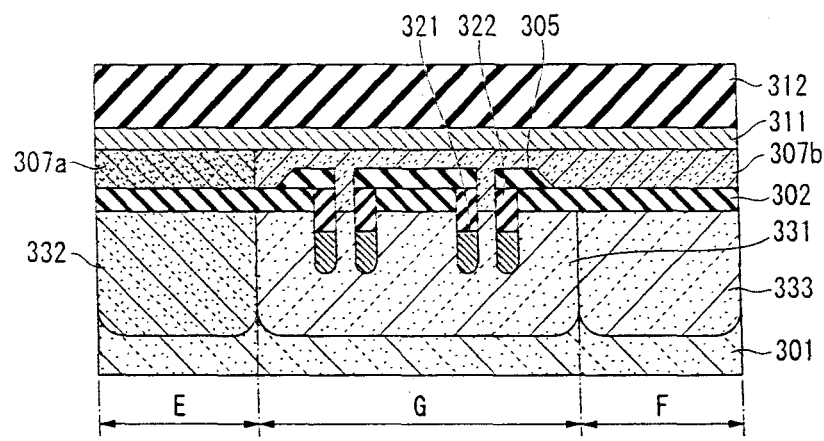
FIG. 41 is a fragmentary cross sectional elevation view illustrating the MOS transistor in a step, subsequent to the step of FIG. 40, involved in the method of forming the semiconductor device in the related art.

As shown in FIG. 41, after the mask 309 is removed, a conductive film 311 and a silicon nitride ($Si_3N_4$) film 312 are stacked on the first and second doped poly-Si films 307a and 307b.

The conductive film 311 includes, for example, a stack of a tungsten film and a tungsten nitride (WN) film.

Figure 42:
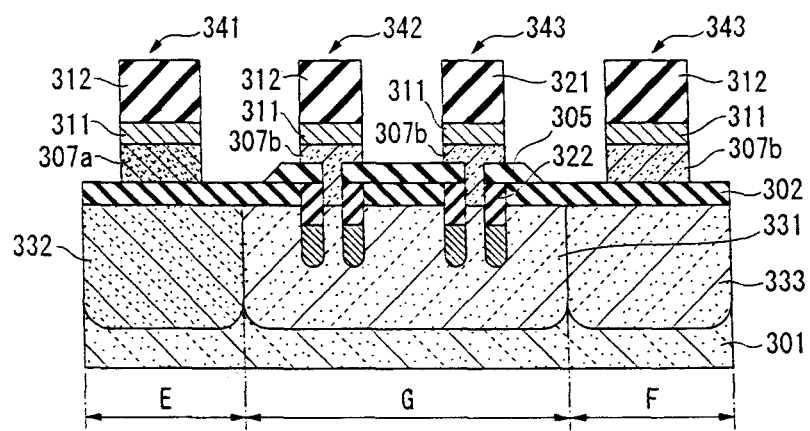
FIG. 42 is a fragmentary cross sectional elevation view illustrating the MOS transistor in a step, subsequent to the step of FIG. 41, involved in the method of forming the semiconductor device in the related art.

As shown in FIG. 42, the first and second doped poly-Si films 307a and 307b, the conductive film 311, and the silicon nitride film 312 are etched by a photolithography technique, and thus interconnection layers 341, 342, and 343 are formed.

As a result, the interconnection layer 341 obtained by sequentially stacking the first doped poly-Si film 307a, the conductive film 311, and the silicon nitride film 312 is formed in the peripheral circuit region E. The interconnection layer 341 serves as a word line of a planar transistor in the peripheral circuit region E.

A pair of interconnection layers 342 obtained by sequentially stacking the second doped poly-Si film 307b, the conductive film 311, and the silicon nitride film 312 are formed in the memory cell region G. Each of the interconnection layers 342 serves as a bit line of the transistor Tr in the memory cell region G.

The bit line extends to a peripheral circuit region (not shown) and serves as a word line of a planar transistor in the corresponding peripheral circuit region.

The interconnection layer 343 obtained by sequentially stacking the second doped poly-Si film 307b, the conductive film 311, and the silicon nitride film 312 is formed in the peripheral circuit region F. The interconnection layer 343 serves as a word line of a planar transistor in the peripheral circuit region F.

In the method of forming a semiconductor device in the related art, there is performed twice each of a mask forming process and an ion implantation process for forming the well layers 332 and 333 in the peripheral circuit regions E and F.

There is performed twice each of a mask forming process and an ion implantation process for forming the first and second doped poly-Si films 307a and 307b in the peripheral circuit regions E and F.

Thus, since the method of forming the semiconductor device in the related art involves performing the mask forming process and the ion implantation process four times in total, a fabrication process have been complicated due to a large number of process steps.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a method of forming a semiconductor device may include, but is not limited to, the following processes. A first well including a memory cell region of a semiconductor substrate is formed. A second well including a first peripheral circuit region of the semiconductor substrate is formed after forming the first well.

In some cases, the method may further include, but is not limited to, the following processes. A first semiconductor layer is formed over the semiconductor substrate before forming the second well. A first mask is formed over the first semiconductor layer. A first impurity is introduced into the first semiconductor layer by using the first mask to form a first impurity-introduced region in the semiconductor layer. Forming the second well includes introducing a second impurity into the first peripheral circuit region by using the first mask.

In some cases, the method may further include, but is not limited to, forming a transistor in the first well before forming the first mask.

In some cases, the method may include, but is not limited to, the first impurity being different in conductivity type from the second impurity.

In some cases, the method may further include, but is not limited to, selectively removing the first impurity-introduced region to form a wiring.

In some cases, the method may further include, but is not limited to, the following processes. A second mask is formed over the first semiconductor layer. A third impurity is introduced into the semiconductor substrate using the second mask to form a third well in the semiconductor substrate after introducing the second impurity.

In some cases, the method may further include, but is not limited to, introducing a fourth impurity into the semiconductor layer using the second mask after introducing the third impurity.

In some cases, the method may include, but is not limited to, the second well being adjacent to the first well.

In some cases, the method may further include, but is not limited to, forming a third well in a second peripheral circuit region of the semiconductor substrate after forming the second well.

In another embodiment, a method for forming a semiconductor device may include, but is not limited to, the following processes. A first impurity is introduced into a semiconductor substrate to form a first well in the semiconductor substrate. A semiconductor layer is formed over the semiconductor substrate. A second impurity is introduced into the semiconductor substrate using a first mask to form a second well in the semiconductor substrate. A third impurity is introduced into the semiconductor layer using the first mask to form a first impurity-introduced region in the semiconductor layer.

In some cases, the method may include, but is not limited to, the second well being adjacent to the first well.

In some cases, the method may further include, but is not limited to, selectively removing the first impurity-introduced region to form a wiring after introducing the third impurity.

In some cases, the method may further include, but is not limited to, introducing a fourth impurity into the semiconductor substrate using a second mask to form a third well in the semiconductor substrate after introducing the third impurity.

In some cases, the method may further include, but is not limited to, introducing a fifth impurity into the semiconductor layer using the second mask after introducing the fourth impurity.

In some cases, the method may further include, but is not limited to, forming a transistor in the first well before introducing the second impurity.

In still another embodiment, a method for forming a semiconductor device may include, but is not limited to, the following processes. A first impurity is introduced into a semiconductor substrate to form a first well including a memory cell region. A semiconductor layer is formed over the semiconductor substrate. A second impurity is introduced into the semiconductor substrate through the semiconductor layer using a first mask to form a second well including a first peripheral circuit region. The second well is adjacent to the first well. A third impurity is introduced into the semiconductor layer over the second well using the first mask to form the first impurity-introduced region.

In some cases, the method may further include, but is not limited to, selectively removing the first impurity-introduced region to form a wiring over the second well after introducing the third impurity.

In some cases, the method may further include, but is not limited to, introducing a fourth impurity into the semiconductor substrate through the semiconductor layer using a second mask to form a third well in a second peripheral circuit region in the semiconductor substrate after introducing the third impurity.

In some cases, the method may further include, but is not limited to, introducing a fifth impurity into the semiconductor layer which is disposed over the third well using the second mask after introducing the fourth impurity.

In some cases, the method may further include, but is not limited to, forming a transistor in the first well before introducing the second impurity.

Hereinafter, a semiconductor device according to an embodiment of the invention will be described in detail with reference to the drawings. In the drawings used for the following description, to easily understand characteristics, there is a case where characteristic parts are enlarged and shown for convenience' sake, and ratios of constituent elements may not be the same as in reality. Materials, sizes, and the like exemplified in the following description are just examples. The invention is not limited thereto and may be appropriately modified within a scope which does not deviate from the concept of the invention.

First Embodiment

Hereinafter, a method of forming a semiconductor device according to a first embodiment of the present invention will be described with reference to the appended drawings.

A method of forming a semiconductor device according to the present embodiment includes the following processes. A MOS transistor forming process may include forming a first well of a first conductivity type in a first region of a semiconductor substrate and forming a MOS transistor in the first well of the first region. A second region forming process may include forming a second well by implanting a dopant of a first or second conductivity type into a second region of the semiconductor substrate. A process may include forming a third well by implanting a dopant of the first or second conductivity type into a third region of the semiconductor substrate. An interconnection forming process may include forming a bit interconnection layer of the MOS transistor in the first region and forming another interconnection layer in the second and third regions.

Hereinafter, the respective processes will be sequentially described.

MOS Transistor Forming Process

Figure 1:
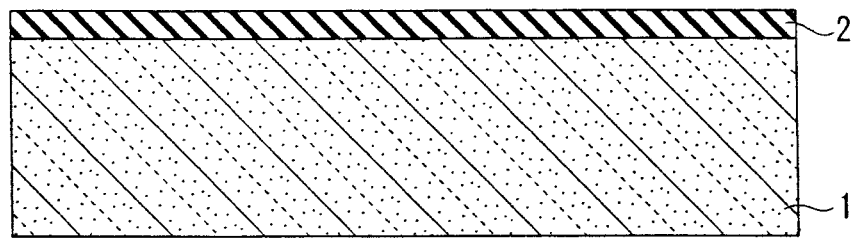
FIG. 1 is a fragmentary cross sectional elevation view illustrating a MOS transistor in a step involved in a method of forming a semiconductor device in accordance with one embodiment of the present invention.

Initially, the MOS transistor forming process includes preparing an isolation region (not shown) and an active region defined by the isolation region in a semiconductor substrate 1. FIG. 1 illustrates a portion of the active region of the semiconductor substrate 1. As shown in FIG. 1, a first insulating film 2 is formed on the semiconductor substrate 1. The first insulating film 2 may be, but is not limited to, a silicon oxide film formed using a thermal oxidation process.

Figure 2:
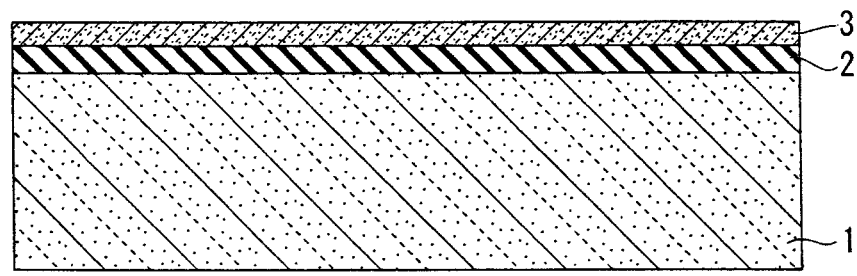
FIG. 2 is a fragmentary cross sectional elevation view illustrating the MOS transistor in a step, subsequent to the step of FIG. 1, involved in the method of forming the semiconductor device in accordance with one embodiment of the present invention.

As shown in FIG. 2, a first semiconductor film 3 is formed on the entire surface of the first insulating film 2. The first semiconductor film 3 may be, but is not limited to, formed of a poly-Si film containing no dopant using a chemical vapor deposition (CVD) process.

Figure 3:
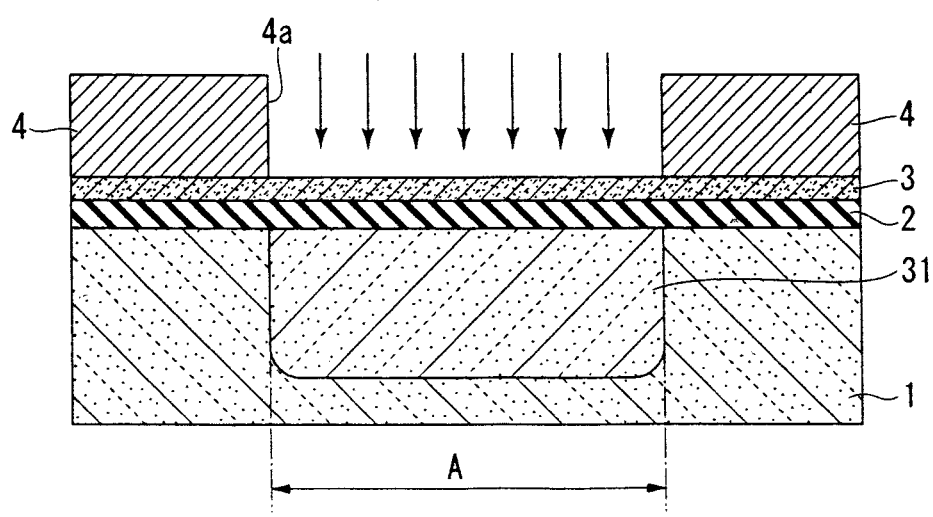
FIG. 3 is a fragmentary cross sectional elevation view illustrating the MOS transistor in a step, subsequent to the step of FIG. 2, involved in the method of forming the semiconductor device in accordance with one embodiment of the present invention.

As shown in FIG. 3, a mask 4 for forming a first region A is formed on the first semiconductor film 3.

An opening 4a corresponding to the first region A is provided in the mask 4 for forming the first region A. The first region A is a partial region of the active region.

A dopant of a first conductivity type is implanted into the semiconductor substrate 1 via the opening 4a of the mask 4, thereby forming a first well 31. The dopant of the first conductivity type may be a p-type dopant so that a p-type first well 31 can be formed in the first region A.

Figure 4:
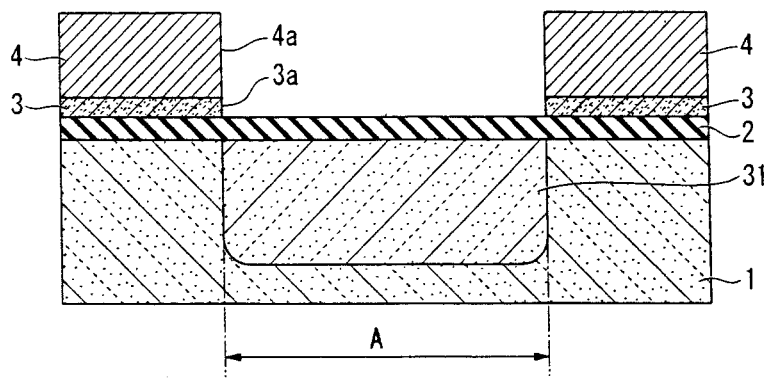
FIG. 4 is a fragmentary cross sectional elevation view illustrating the MOS transistor in a step, subsequent to the step of FIG. 3, involved in the method of forming the semiconductor device in accordance with one embodiment of the present invention.

As shown in FIG. 4, by etching the first semiconductor film 3 using the mask 4 as an etch mask, the first semiconductor film 3 disposed in the first region A is removed, thereby the first insulating film 2 being partially shown.

Figure 5:
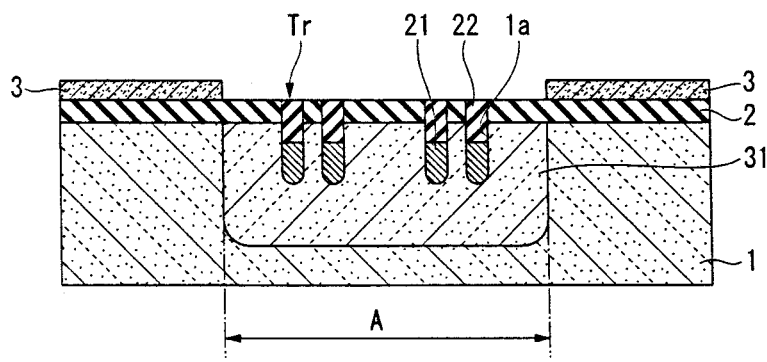
FIG. 5 is a fragmentary cross sectional elevation view illustrating the MOS transistor in a step, subsequent to the step of FIG. 4, involved in the method of forming the semiconductor device in accordance with one embodiment of the present invention.

As shown in FIG. 5, a groove 1a for a gate electrode is prepared to penetrate the first insulating film 2 and reach the first well 31. A gate insulating film (e.g., a silicon oxide film) (not shown) is formed by a thermal oxidation process on an inner surface of the groove 1a. A gate electrode 21 formed of, for example, tungsten is buried in the groove 1a. A buried insulating film 22 formed of, for example, a silicon oxide film is formed on the gate electrode 21 to be buried in the groove 1a. A dopant of a second conductivity type is implanted into portions of the first well 31 of the first conductivity type, which are positioned on both sides of the groove 1a, thereby forming impurity diffusion regions (not shown). The impurity diffusion regions serve as source and drain regions of a field effect transistor (FET). Thus, a MOS transistor Tr including the gate electrode 21 buried in the semiconductor substrate 1 is formed.

Figure 6:
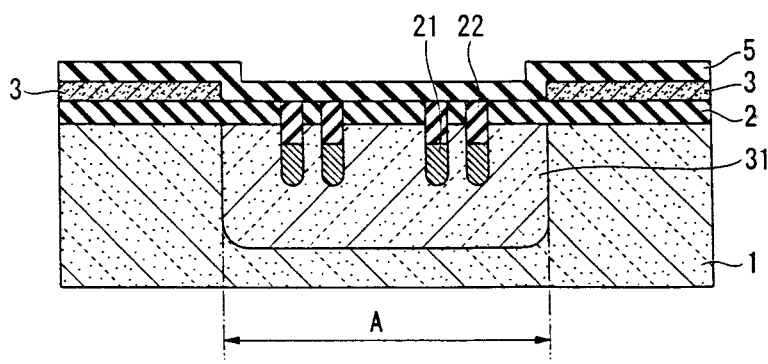
FIG. 6 is a fragmentary cross sectional elevation view illustrating the MOS transistor in a step, subsequent to the step of FIG. 5, involved in the method of forming the semiconductor device in accordance with one embodiment of the present invention.

As shown in FIG. 6, a second insulating film 5 formed of, for example, a silicon oxide film is formed on the first insulating film 2 and the first semiconductor film 3. The second insulating film 5 is formed on the first region A of the semiconductor substrate 1 and a region other than the first region A.

Figure 7:
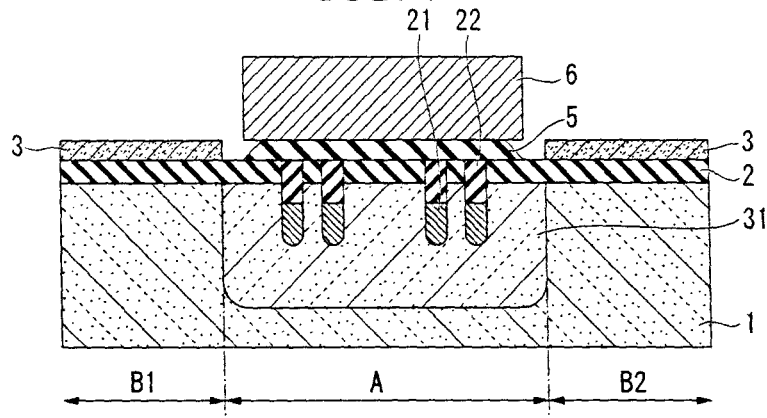
FIG. 7 is a fragmentary cross sectional elevation view illustrating the MOS transistor in a step, subsequent to the step of FIG. 6, involved in the method of forming the semiconductor device in accordance with one embodiment of the present invention.

As shown in FIG. 7, an etch mask 6 is formed on the second insulating film 5 of the first region A. The second insulating film 5 is dry etched using the etch mask 6, thereby removing the second insulating film 5 from second and third regions B1 and B2. Thus, the second insulating film 5 remains only over the first region A. Both the second and third regions B1 and B2 are disposed adjacent to the first region A. The second and third regions B1 and B2 are included in the active region of the semiconductor substrate 1.

Figure 8:
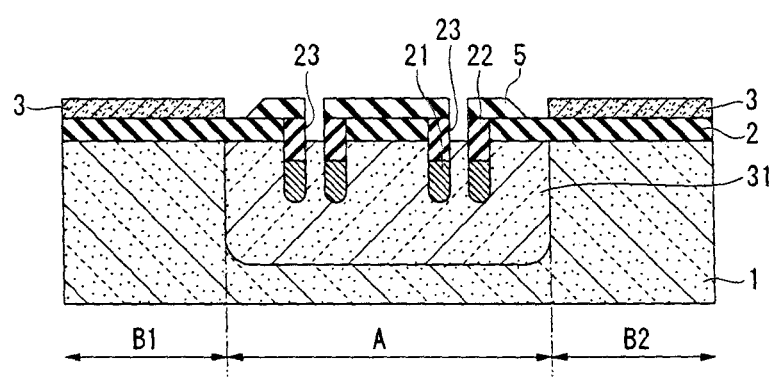
FIG. 8 is a fragmentary cross sectional elevation view illustrating the MOS transistor in a step, subsequent to the step of FIG. 7, involved in the method of forming the semiconductor device in accordance with one embodiment of the present invention.

As shown in FIG. 8, after the mask 6 is removed, bit contact holes 23 are prepared to penetrate the second and first insulating films 5 and 2. The semiconductor substrate 1 is shown through the bit contact holes 23.

Figure 9:
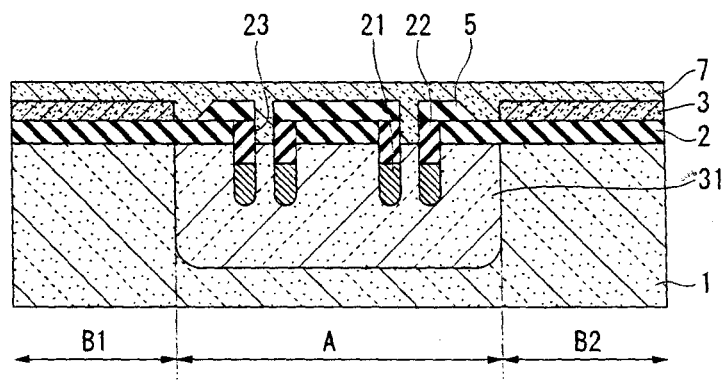
FIG. 9 is a fragmentary cross sectional elevation view illustrating the MOS transistor in a step, subsequent to the step of FIG. 8, involved in the method of forming the semiconductor device in accordance with one embodiment of the present invention.

As shown in FIG. 9, a second semiconductor film 7 is formed on the second insulating film 5 and the first semiconductor film 3 to be buried in the bit contact holes 23. The second semiconductor film 7 may be, but is not limited to, a semiconductor film of the first conductivity type. Also, the second semiconductor film 7 may be, but is not limited to, a poly-Si film doped with an n-type dopant, such as phosphorus (P) ion. The second semiconductor film 7 may be formed by, for example, a CVD process. A surface of the second semiconductor film 7 may be planarized. By planarizing the surface of the second semiconductor film 7, an ion implantation mask may be easily formed during a subsequent process.

Second Region Forming Process

Figure 10:
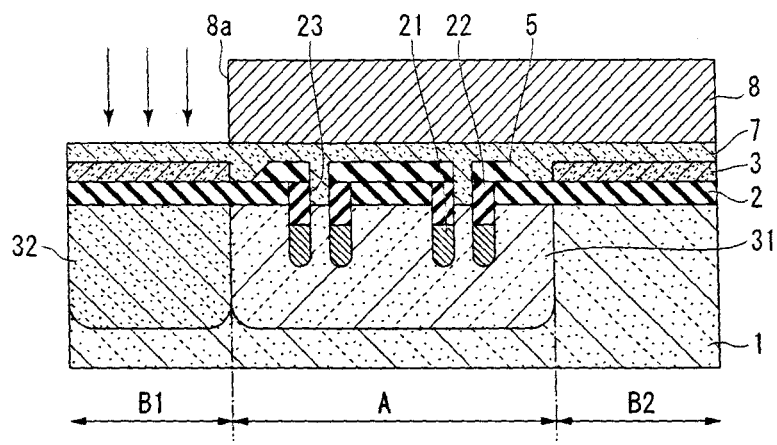
FIG. 10 is a fragmentary cross sectional elevation view illustrating the MOS transistor in a second region forming step, subsequent to the step of FIG. 9, involved in the method of forming the semiconductor device in accordance with one embodiment of the present invention.
Figure 11:
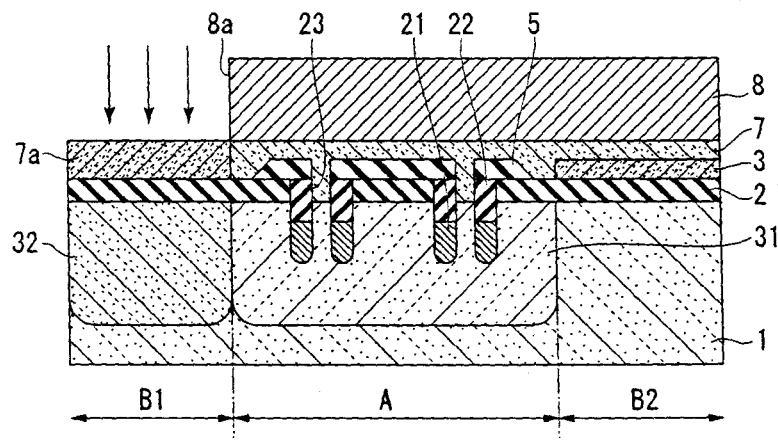
FIG. 11 is a fragmentary cross sectional elevation view illustrating the MOS transistor in the second region forming step, subsequent to the step of FIG. 10, involved in the method of forming the semiconductor device in accordance with one embodiment of the present invention.

In the second region forming process, as shown in FIG. 10, a mask 8 for forming the second region B1 is formed on the second semiconductor film 7. A second well 32 is formed by implanting a dopant of the first or second conductivity type into the second region B1. As shown in FIG. 11, a dopant of the first or second conductivity type is implanted into at least the second semiconductor film 7 of the second region B1. The dopant of the second conductivity type may be different in conductivity type from the dopant of the first conductivity type. When the first conductivity type is a p-type, the second conductivity type is an n-type.

Specifically, as shown in FIG. 10, the mask 8 for the ion implantation in the second region B1 is formed on the second semiconductor film 7. An opening 8a through which the second region B1 is shown is formed in the mask 8. The dopant of the first or second conductivity type is implanted into the semiconductor substrate 1 of the second region B1 via the opening 8a by an ion implantation process. In an example of FIG. 10, a second well 32 of the second conductivity type (e.g., an n-type) is formed by implanting a dopant of the second conductivity type (e.g., P ion as an n-type dopant).

As shown in FIG. 11, using the mask 8 for the ion implantation formed in the second region B1 as a mask, the dopant of the first or second conductivity type is implanted into the second semiconductor film 7 of the second region B1 using an ion implantation process via the opening 8a of the mask 8. The implanted dopant can diffuse to the first semiconductor film 3 disposed under the second semiconductor film 7. Thus, the first and second semiconductor films 3 and 7 disposed in the second region B1 serve as a third semiconductor film 7a of the first or second conductivity type. In an example of FIG. 11, in contrast to the second well 32 having the second conductivity type, a dopant of the first conductivity type (e.g., boron (B) ions as the p-type dopant) is implanted into the second semiconductor film 7, thereby forming the third semiconductor film 7a of the first conductivity type on the second region B1. Since a close region of the third semiconductor film 7a that is close to the semiconductor substrate 1 in a thickness direction was originally the undoped first semiconductor film 3, the dopant concentration of the close region of the third semiconductor film 7a is lower than the other region of the third semiconductor film 7a.

In the present embodiment, the second well 32 is formed to have the second conductivity type. The third semiconductor film 7a is formed to have the first conductivity type. However, the present embodiment is not limited thereto. The second well 32 may have the first conductivity type and the third semiconductor film 7a may have the second conductivity type.

Third Region Forming Process

Figure 12:
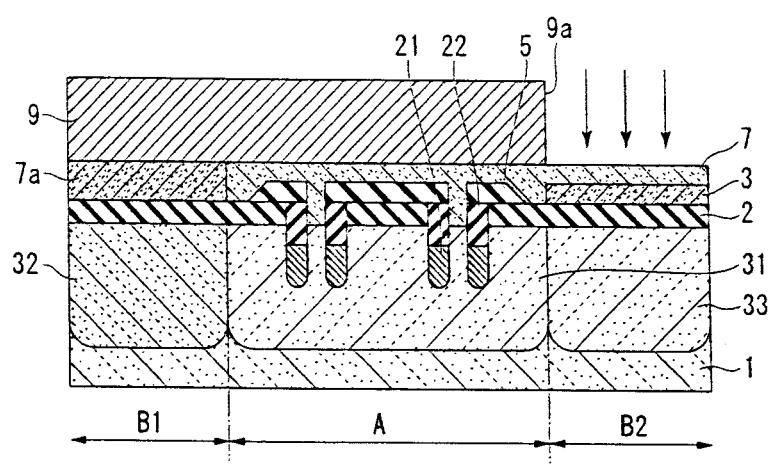
FIG. 12 is a fragmentary cross sectional elevation view illustrating the MOS transistor in a third region forming step, subsequent to the step of FIG. 11, involved in the method of forming the semiconductor device in accordance with one embodiment of the present invention.
Figure 13:
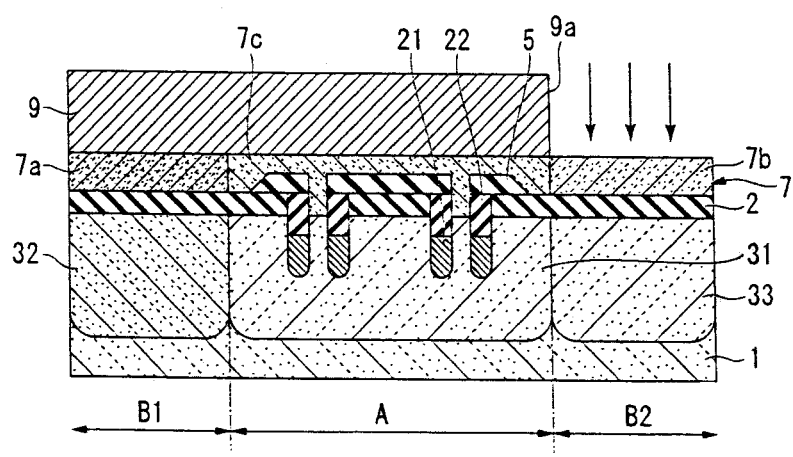
FIG. 13 is a fragmentary cross sectional elevation view illustrating the MOS transistor in the third region forming step, subsequent to the step of FIG. 12, involved in the method of forming the semiconductor device in accordance with one embodiment of the present invention.

In the third region forming process, as shown in FIG. 12, a mask 9 for forming the third region B2 is formed on the second and third semiconductor films 7 and 7a, and a dopant of the first or second conductivity type are implanted into the third region B2, thereby forming a third well 33. As shown in FIG. 13, a dopant of the first or second conductivity type is implanted into at least the semiconductor film 7 of the third region B2.

As shown in FIG. 12, an ion implantation mask 9 for forming the third region B2 is formed on the second and third semiconductor films 7 and 7a. The ion implantation mask 9 has an opening 9a. A surface of the third region B2 is shown through the opening 9a. The dopant of the first or second conductivity type is implanted into the semiconductor substrate 1 of the third region B2 by an ion implantation process via the opening 9a. Thus, the third well 33 of the first or second conductivity type is formed in the third region B2. In an example of FIG. 12, a dopant of the first conductivity type (e.g., B ions as a p-type dopant) is implanted, thereby forming the third well 33 of the first conductivity type (i.e., p-type).

As shown in FIG. 13, using the mask 9 as an etching mask, the dopant of the first or second conductivity type is implanted by an ion implantation process into the second semiconductor film 7 via the opening 9a of the mask 9. The implanted dopant partially reaches the first semiconductor film 3 disposed under the second semiconductor film 7. Thus, the first and second semiconductor films 3 and 7 formed in the third region B2 serve as a semiconductor film of the first or second conductivity type. In an example of FIG. 13, in contrast to the third well 33 having the first conductivity type (e.g., the p type), a dopant of the first conductivity type (e.g., B ion as a p-type dopant) is implanted into the second semiconductor film 7, thereby forming a fourth semiconductor film 7b of the first conductivity type on the third region B2. The first and second semiconductor films 3a and 7 are formed in turn before the ion implantation is carried out to introduce the impurity into both the first and second semiconductor films 3a and 7. The fourth semiconductor film 7b has the lower region closer to the semiconductor substrate 1 than the upper region. The lower region was formed from the undoped first semiconductor film 3. The upper region was formed from the doped fourth semiconductor film 7. The lower region is lower in dopant concentration than the upper region.

In the present embodiment, the third well 33 is formed to have the second conductivity type, and the fourth semiconductor film 7b is formed to have the first conductivity type. However, the present embodiment is not limited thereto. The third well 33 may have the first conductivity type, and the fourth semiconductor film 7b may have the second conductivity type.

Interconnection Forming Process

Figure 14:
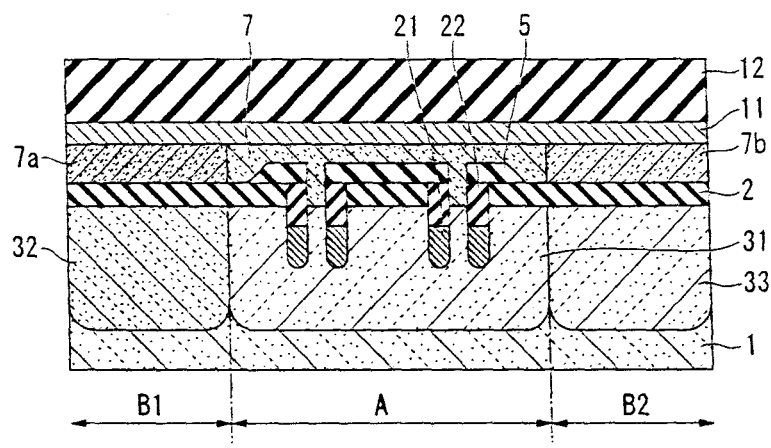
FIG. 14 is a fragmentary cross sectional elevation view illustrating the MOS transistor in an interconnection forming step, subsequent to the step of FIG. 13, involved in the method of forming the semiconductor device in accordance with one embodiment of the present invention.

As shown in FIG. 14, after the mask 9 is removed, a conductive film 11 and a third insulating film 12 are stacked on the second through fourth semiconductor films 7, 7a, and 7b. The conductive film 11 may include, but is not limited to, a stack of a tungsten film and a tungsten nitride film. The third insulating film 12 may include, but is not limited to, a silicon nitride film.

Figure 15:
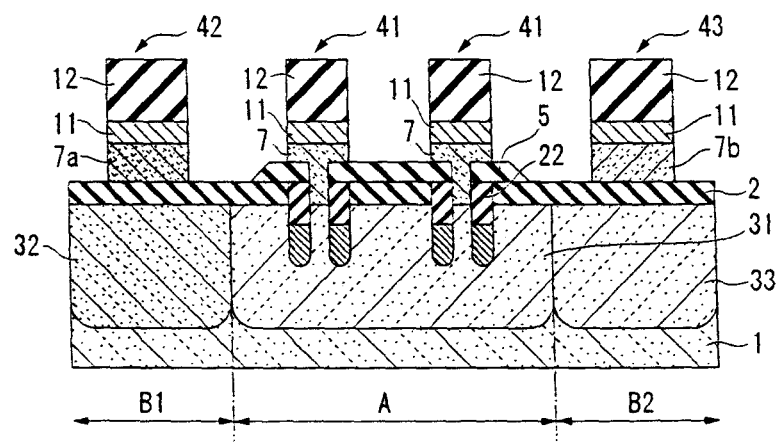
FIG. 15 is a fragmentary cross sectional elevation view illustrating the MOS transistor in the interconnection forming step, subsequent to the step of FIG. 14, involved in the method of forming the semiconductor device in accordance with one embodiment of the present invention.

As shown in FIG. 15, the second through fourth semiconductor films 7, 7a, and 7b, the conductive film 11, and the third insulating film 12 are etched using a photolithography technique, thereby forming interconnection layers 41, 42, and 43.

As a result, the interconnection layer 41 is formed in the first region A. The interconnection layer 41 is formed by sequentially stacking the second semiconductor film 7, the conductive film 11, and the third insulating film 12 over the substrate 1 and patterning the stack. The interconnection layer 41 serves as a bit line of a transistor Tr in the first region A. The bit line extends to a peripheral circuit region (not shown). The bit line serves as a word line of a planar transistor in the peripheral circuit region.

The interconnection layer 42 is formed in the second region B1. The interconnection layer 42 is formed by sequentially stacking the third semiconductor film 7a, the conductive film 11, and the third insulating film 12 over the substrate 1 and patterning the stack. The interconnection layer 42 serves as a word line of a planar transistor in the second region B1.

The interconnection layer 43 is formed in the third region B2. The interconnection layer 43 is formed by sequentially stacking the fourth semiconductor film 7b, the conductive film 11, and the third insulating film 12 over the substrate 1 and patterning the stack. The interconnection layer 43 serves as a word line of a planar transistor in the third region B2.

After forming the respective interconnection layers 41 through 43, the method of forming the semiconductor device according to the present embodiment may include the following processes. A first interlayer insulating film is formed to cover the respective interconnection layers 41 through 43. A contact plug is formed in the first interlayer insulating film to be connected to the drain region of the MOS transistor Tr. A second interlayer insulating film is formed on the first interlayer insulating film. A capacitor connected to the contact plug may be formed over the second interlayer insulating film. The MOS transistor Tr and the capacitor form a memory cell for a dynamic random access memory (DRAM).

In stead of the capacitor, another memory device, such as a phase-change material device, may be used in the semiconductor device.

A memory cell may include the MOS transistor Tr and a memory device connected to the MOS transistor Tr. The memory device may be various memory devices, such as the capacitor. In the semiconductor device including the memory cell, for example, the first region A serves as a memory cell region, and each of the second and third regions B1 and B2 serves as a peripheral circuit region.

According to the method of forming the semiconductor device, the mask 8 with opening over the second region B1 is used in two different ion implantation processes. The first ion implantation process is to implant the dopant of the second conductivity type into the substrate 1 in the second region B1 for forming the second well 32 in the second region B1. The second ion implantation process is to implant the dopant of the first conductivity type into the first and second semiconductor films 3 and 7 in the second region B1. The second region B1 is different from the first region A1 in which the MOS transistor Tr is formed as described above. In the present embodiment, no formation of any mask in addition to the mask 8 is required during the second region forming process.

According to the method of forming the semiconductor device, the mask 9 with opening over the third region B2 is used in two different ion implantation processes. The first ion implantation process is to implant the dopant of the second conductivity type into the substrate 1 in the third region B2 for forming the third well 33 in the third region B2. The second ion implantation process is to implant the dopant of the first conductivity type into the first and second semiconductor films 3 and 7 in the second region B2. The third region B2 is different from the first and second regions A1 and B1 as described above. In the present embodiment, no formation of any mask in addition to the mask 9 is required during the second region forming process.

According to the method of forming the semiconductor device as described above, only two masks are required to be formed during the processes of forming the second and third regions B1 and B2. Thus, the number of processes for forming the semiconductor device may be reduced, thereby simplifying in total the series of fabrication processes.

According to the method of forming the semiconductor device, when the dopant of the first conductivity type is implanted into the second semiconductor film 7 of the second region B1, the dopant may reach the first semiconductor film 3 disposed under the second semiconductor film 7. The first semiconductor film 3 was undoped. The second semiconductor film 7 was doped. Then, the ion implantation process was performed to implant the impurity into both the undoped first semiconductor film 3 and the doped second semiconductor film 7. The lower regions of the third and fourth semiconductor films 7a and 7b are lower in concentration than the upper regions of the third and fourth semiconductor films 7a and 7b, respectively. The lower regions of the third and fourth semiconductor films 7a and 7b are closer to the semiconductor substrate 1 than the upper portions of the third and fourth semiconductor films 7a and 7b, respectively. The interconnection layer 42 includes the third semiconductor film 7a, the conductive film 11, and the insulating film 12. The interconnection layer 42 performs as a gate electrode in a PMOS transistor of a peripheral circuit. The gate electrode has a lower portion which is closer to the semiconductor substrate 1 than other portions. The lower portion has a lower impurity concentration than the other portions. The lower portion has an interface region to a gate insulating film. The interface region may be almost non-doped. The bottom of the gate electrode in contact with the gate insulating film may be almost non-doped. As a result, if an impurity were counter-doped into the gate electrode including the non-doped region, the amount of counter-dopant could be reduced as compared to when the bottom of the gate electrode is not non-doped.

According to the method of forming the semiconductor device, in the MOS transistor forming process, forming the second semiconductor film 7 by the semiconductor film of the first conductivity type makes it easy to form a bit contact of the MOS transistor.

According to the method of forming the semiconductor device, the MOS transistor forming process includes the following processes. The grooves 1a are prepared in the first well 31. The gate insulating film and the gate electrode 21 are sequentially formed in the groove 1a. The dopant of the second conductivity type is implanted into the first well 31 to form an impurity diffusion region. The MOS transistor Tr is formed in the first well 31. The formed MOS transistor Tr, which is a trench-gate transistor, may be ensured to have a sufficient channel length. The gate electrode 21 (word line) is buried in the semiconductor substrate 1. Thus, the interconnection layer 41 can be greater in width than when the word line would have been formed on the semiconductor substrate 1.

According to the method of forming the semiconductor device, in the MOS transistor forming process, the first well 31 is formed in the first region A only but not formed in the second and third regions B1 and B2. During a subsequent process, the second and third wells 32 and 33 are formed in the second and third regions B1 and B2 respectively using an ion implantation method. Thus, dopant concentrations of the second and third wells 32 and 33 may be adjusted during the processes of forming the second and third regions B1 and B2, thereby precisely controlling electrical properties of the second and third wells 32 and 33.

The dopant concentrations of the first through third regions A, B1, and B2 may be independently controlled.

The interconnection layer forming process may be followed by a process of forming the capacitor connected to the MOS transistor, thereby efficiently forming a DRAM.

Second Embodiment

Hereinafter, a method of forming a semiconductor device according to a second embodiment of the present invention will be described with reference to the appended drawings.

The method of forming the semiconductor device according to the present embodiment may include the following processes. A MOS transistor forming process may include forming a first well of a first conductivity type in a semiconductor substrate and forming a MOS transistor in the first well disposed in a first region. A second region forming process may include forming a second well by implanting dopant of a first or second conductivity type into a second region of the semiconductor substrate. An interconnection forming process may include forming a bit interconnection layer for the MOS transistor in the first region and forming another interconnection layer in the second region. Hereinafter, the respective processes will be sequentially described.

MOS Transistor Forming Process

Figure 16:
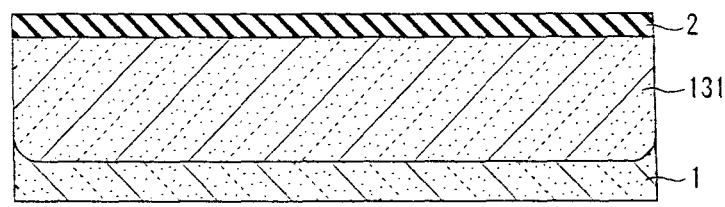
FIG. 16 is a fragmentary cross sectional elevation view illustrating a MOS transistor in a step involved in a method of forming a semiconductor device in accordance with another embodiment of the present invention.

An isolation region (not shown) and an active region defined by the isolation region are prepared in a semiconductor substrate 1. As shown in FIG. 16, a first insulating film 2 (e.g., a silicon oxide film) is formed by a thermal oxidation process on the semiconductor substrate 1 having the active region.

Dopants of a first conductivity type are implanted into the entire active region of the semiconductor substrate 1, thereby forming a first well 131. The dopants of the first conductivity type are preferably p-type dopants. Thus, a p-type first well 131 is formed in the semiconductor substrate 1.

Figure 17:
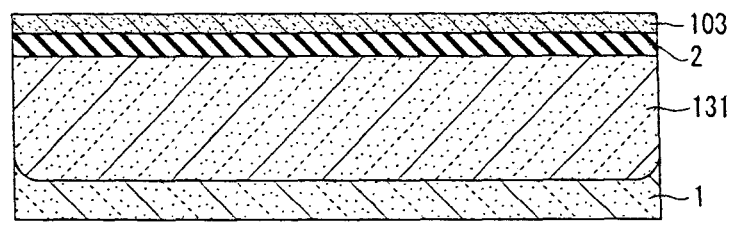
FIG. 17 is a fragmentary cross sectional elevation view illustrating the MOS transistor in a step, subsequent to the step of FIG. 16, involved in the method of forming the semiconductor device in accordance with another embodiment of the present invention.

As shown in FIG. 17, a first semiconductor film 103 is formed on the entire surface of the first insulating film 2. The first semiconductor film 103 may be, but is not limited to, formed of a poly-Si film containing a dopant. Also, the first semiconductor film 103 may be, but is not limited to, a poly-Si film doped with B ion as a p-type dopant. The first semiconductor film 103 may be, but is not limited to, formed using a CVD process.

Figure 18:
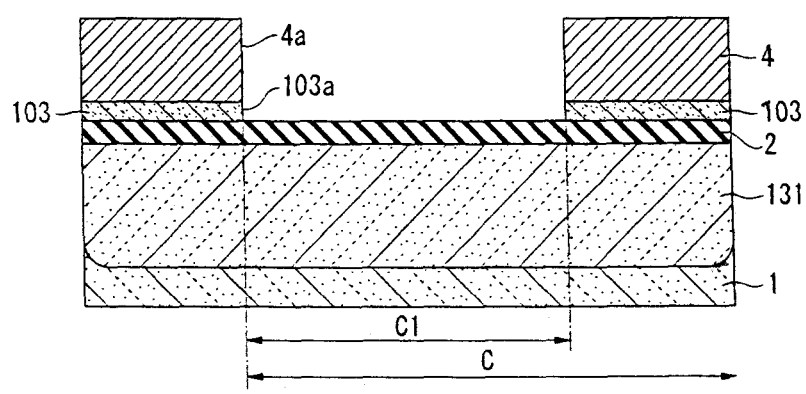
FIG. 18 is a fragmentary cross sectional elevation view illustrating the MOS transistor in a step, subsequent to the step of FIG. 17, involved in the method of forming the semiconductor device in accordance with another embodiment of the present invention.

As shown in FIG. 18, a mask 4 is formed on the first semiconductor film 103. The mask 4 includes an opening 4a corresponding to a transistor forming region A1 of a first region A.

By etching the first semiconductor film 103 using the mask 4 as an etch mask, the first semiconductor film 103 is removed from the transistor forming region C1 of the first region C, thereby the first insulating film 2 being partially shown.

Figure 19:
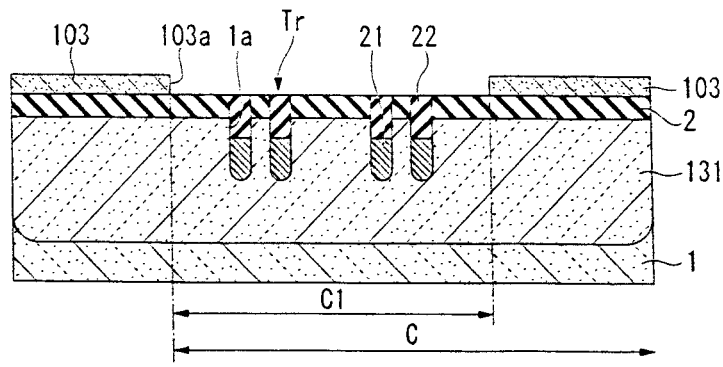
FIG. 19 is a fragmentary cross sectional elevation view illustrating the MOS transistor in a step, subsequent to the step of FIG. 18, involved in the method of forming the semiconductor device in accordance with another embodiment of the present invention.

As shown in FIG. 19, a groove 1a for a gate electrode is prepared to penetrate the first insulating film 2 and the first well 131. A gate insulating film (e.g., a silicon oxide film) (not shown) is formed by a thermal oxidation process on an inner surface of the groove 1a. A gate electrode 21 formed of, for example, tungsten is buried in the groove 1a. A buried insulating film 22 formed of, for example, a silicon oxide film is further formed on the gate electrode 21 to be buried in the groove 1a. A dopant of a second conductivity is implanted into portions of the first well 131 of the first conductivity type, which are positioned on both sides of the groove 1a, thereby forming impurity diffusion regions (not shown). The impurity diffusion regions serve as source and drain regions of an FET. Thus, a MOS transistor Tr including the gate electrode 21 buried in the semiconductor substrate 1 is formed.

Figure 20:
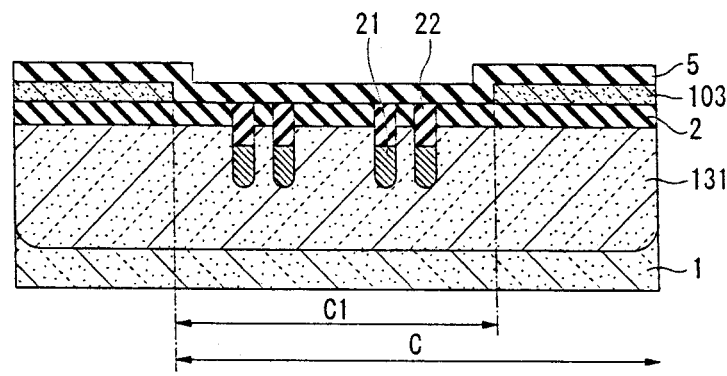
FIG. 20 is a fragmentary cross sectional elevation view illustrating the MOS transistor in a step, subsequent to the step of FIG. 19, involved in the method of forming the semiconductor device in accordance with another embodiment of the present invention.

As shown in FIG. 20, a second insulating film 5 formed of, for example, a silicon oxide film is formed on the first insulating film 2 and the first semiconductor film 103. The second insulating film 5 is formed on the first region C of the semiconductor substrate 1 and a region other than the first region C.

Figure 21:
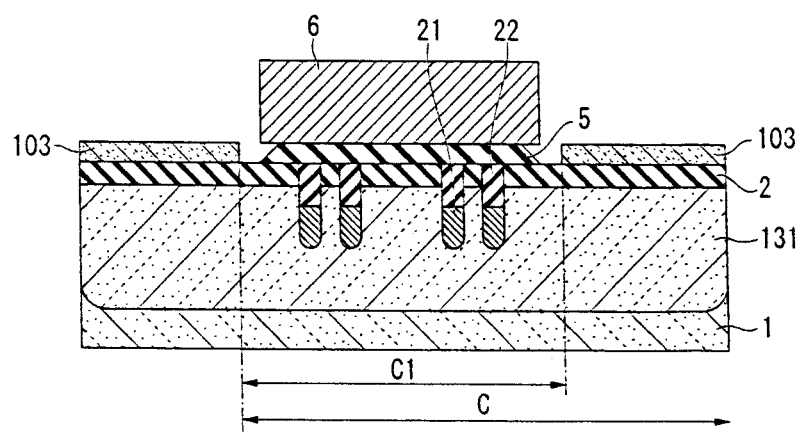
FIG. 21 is a fragmentary cross sectional elevation view illustrating the MOS transistor in a step, subsequent to the step of FIG. 20, involved in the method of forming the semiconductor device in accordance with another embodiment of the present invention.

As shown in FIG. 21, an etch mask 6 is formed on the second insulating film 5 of the first region C. The second insulating film 5 is dry etched using the etch mask 6, thereby removing the second insulating film 5 from the region other than the transistor forming region C1. Thus, the second insulating film 5 remains only on the first region C.

Figure 22:
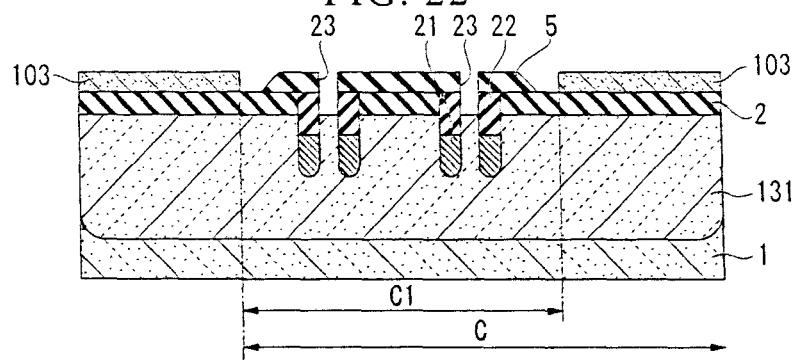
FIG. 22 is a fragmentary cross sectional elevation view illustrating the MOS transistor in a step, subsequent to the step of FIG. 21, involved in the method of forming the semiconductor device in accordance with another embodiment of the present invention.

As shown in FIG. 22, after the mask 6 is removed, bit contact holes 23 are prepared to penetrate the second insulating film 5 and the first insulating film 2. The semiconductor substrate 1 is shown through the bit contact holes 23.

Figure 23:
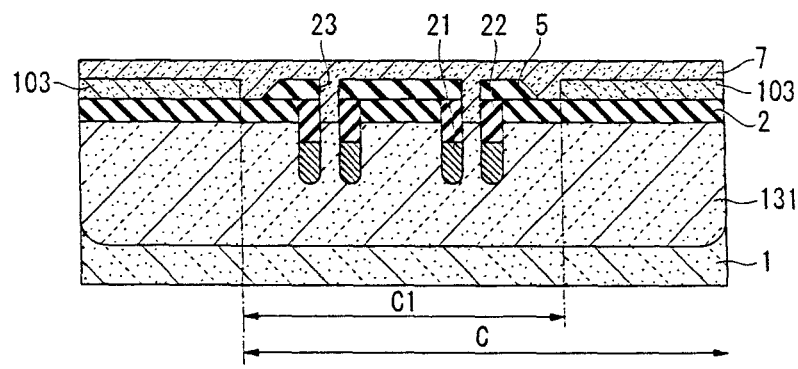
FIG. 23 is a fragmentary cross sectional elevation view illustrating the MOS transistor in a step, subsequent to the step of FIG. 22, involved in the method of forming the semiconductor device in accordance with another embodiment of the present invention.

As shown in FIG. 23, a second semiconductor film 7 is formed on the second insulating film 5 and the first semiconductor film 103 to be buried in the bit contact holes 23. The second semiconductor film 7 may be, but is not limited to, a semiconductor film of the first conductivity type. Also, the second semiconductor film 7 may be, but is not limited to, a poly-Si film doped with an n-type dopant, such P ion. The second semiconductor film 7 may be formed using, for example, a CVD process. A surface of the second semiconductor film 7 may be planarized. By planarizing the surface of the second semiconductor film 7, an ion implantation mask may be easily formed during a subsequent process.

Second Region Forming Process

Figure 24:
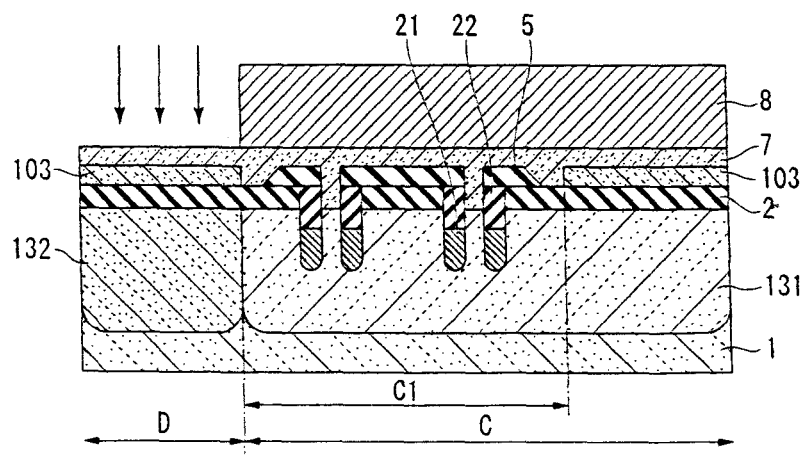
FIG. 24 is a fragmentary cross sectional elevation view illustrating the MOS transistor in a second region forming step, subsequent to the step of FIG. 23, involved in the method of forming the semiconductor device in accordance with another embodiment of the present invention.
Figure 25:
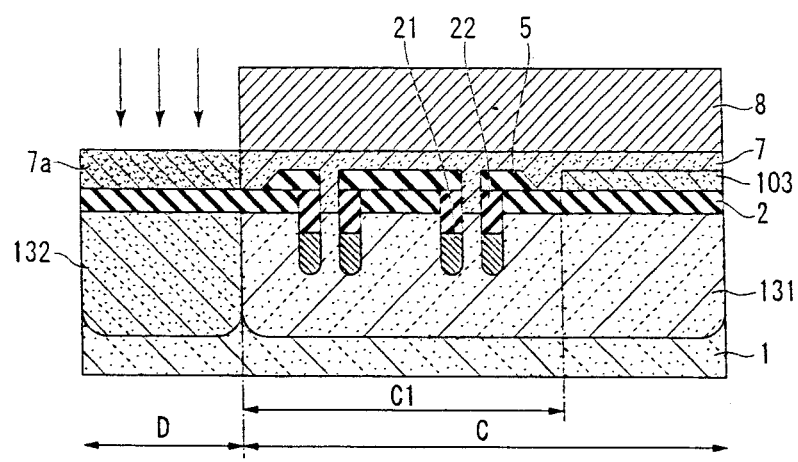
FIG. 25 is a fragmentary cross sectional elevation view illustrating the MOS transistor in the second region forming step, subsequent to the step of FIG. 24, involved in the method of forming the semiconductor device in accordance with another embodiment of the present invention.

In the second region forming process, as shown in FIG. 24, a mask 8 for forming the second region D is formed on the second semiconductor film 7. A second well 132 is formed by implanting a dopant of the first or second conductivity type into the second region B1. As shown in FIG. 25, a dopant of the first or second conductivity type is implanted into at least the second semiconductor film 7 of the second region D.

Specifically, as shown in FIG. 24, the mask 8 for the ion implantation in the second region D is formed on the second semiconductor film 7. An opening 8a through which the second region D is shown is formed in the mask 8. The dopant of the first or second conductivity type is implanted into the semiconductor substrate 1 of the second region D via the opening 8a by an ion implantation process. In an example of FIG. 24, a portion of the first well 131 serves as the second well 132 of the second conductivity type (e.g., the n-type) by implanting a dopant of the second conductivity type (e.g., P ion as the n-type dopant).

As shown in FIG. 25, using the mask 8 formed in the second region D as a mask for the ion implantation, the dopant of the first or second conductivity type is implanted into the second semiconductor film 7 of the second region D via the opening 8a of the mask 8 using an ion implantation process. The implanted dopant may be diffused to the first semiconductor film 3 disposed under the second semiconductor film 7. Thus, the first and second semiconductor films 103 and 7 formed in the second region B1 serve as a third semiconductor film 7a of the first or second conductivity type. In the embodiment of FIG. 11, as contrasted with the second well 132 having the second conductivity type, a dopant of the first conductivity type (e.g., B ion as the p-type dopant) is implanted into the second semiconductor film 7, thereby forming the third semiconductor film 7a of the first conductivity type on the second region D.

In the present embodiment, the second well 132 is formed to have the second conductivity type. The third semiconductor film 7a is formed to have the first conductivity type. However, the present invention is not limited thereto. The second well 132 may have the first conductivity type, and the third semiconductor film 7a may have the second conductivity type.

Interconnection Forming Process

Figure 26:
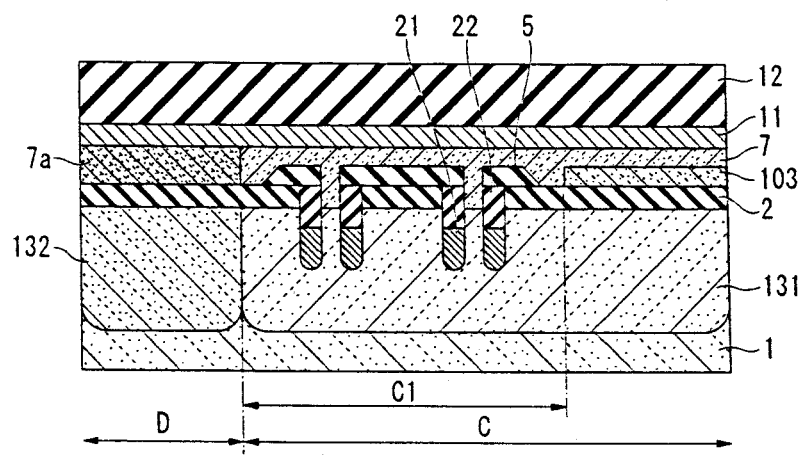
FIG. 26 is a fragmentary cross sectional elevation view illustrating the MOS transistor in an interconnection forming step, subsequent to the step of FIG. 25, involved in the method of forming the semiconductor device in accordance with another embodiment of the present invention.

As shown in FIG. 26, after the mask 8 is removed, a conductive film 11 and a third insulating film 12 are stacked on the second and third semiconductor films 7 and 7a. The conductive film 11 may include, for example, a stack of a tungsten film and a tungsten nitride film. The third insulating film 12 may include, but is not limited to, a silicon nitride film.

Figure 27:
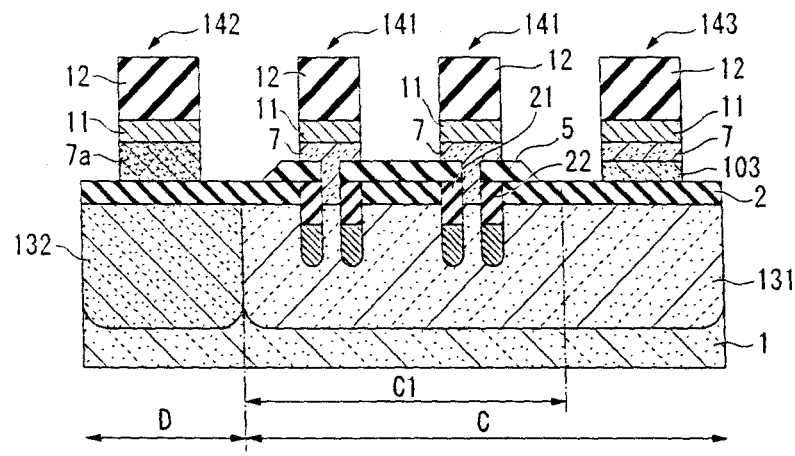
FIG. 27 is a fragmentary cross sectional elevation view illustrating the MOS transistor in the interconnection forming step, subsequent to the step of FIG. 26, involved in the method of forming the semiconductor device in accordance with another embodiment of the present invention.

As shown in FIG. 27, the second and third semiconductor films 7 and 7a, the conductive film 11, and the third insulating film 12 are selectively etched using a photolithography technique, thereby forming interconnection layers 141, 142, and 143.

As a result, the interconnection layers 141 and 143 are formed in the first region C by sequentially stacking the second semiconductor film 7, the conductive film 11, and the third insulating film 12 and patterning the stack. The interconnection layer 141 is formed in the transistor forming region C1 of the first region C. The interconnection layer 141 serves as a bit line of the transistor Tr. The bit line extends to a peripheral circuit region (not shown). The bit line serves as a word line of a planar transistor in the peripheral circuit region.

The interconnection layer 143 is formed in the first region C and not in the transistor forming region C1. The interconnection layer 143 extends to another peripheral circuit region (not shown). The interconnection layer 143 serves as a word line of a planar transistor in the other peripheral circuit region.

The interconnection layer 142 is formed in the second region D by sequentially stacking the third semiconductor film 7a, the conductive film 11, and the third insulating film 12 and patterning the stack. The interconnection layer 142 serves as a word line of a planar transistor in the second region D.

In the method of forming the semiconductor device according to the present embodiment, as in the first embodiment, after the respective interconnection layers 141 to 143 are formed, a first interlayer insulating film, a contact plug, a second interlayer insulating film, and a capacitor may be sequentially formed. The MOS transistor Tr and the capacitor constitute a DRAM.

In stead of the capacitor, another memory device, such as a phase-change material device, may be formed.

A memory cell may include the MOS transistor Tr and a memory device connected to the MOS transistor Tr. The memory device may be various memory devices, such as the capacitor. In the semiconductor device including the memory cell, for example, the first region C serves as a memory cell region, and the second region B1 serves as a peripheral circuit region.

According to the method of forming the semiconductor device, the mask 8 with opening over the second region D is used in two different ion implantation processes. The first ion implantation process is to implant the dopant of the second conductivity type into the substrate 1 in the second region D for forming the second well 132 in the second region D. The second ion implantation process is to implant the dopant of the first conductivity type into the first and second semiconductor films 3 and 7 in the second region D. The second region D is different from the first region C in which the MOS transistor Tr is formed as described above. In the present embodiment, no formation of any mask in addition to the mask 8 is required during the second region forming process. As a result, the number of processes for forming the semiconductor device may be reduced, thereby simplifying in total the series of fabrication processes.

According to the method of forming the semiconductor device, in the MOS transistor forming process, forming the second semiconductor film 7 by the semiconductor film of the first conductivity type makes it easy to form a bit contact of the MOS transistor.

According to the method of forming the semiconductor device, in the MOS transistor forming process includes the following processes. The groove 1a, the gate insulating film, the gate electrode 21, and the impurity diffusion region are sequentially formed, thereby forming a trench-gate MOS transistor Tr. The formed MOS transistor Tr may ensure a sufficient channel length. The gate electrode 21 (word line) is buried in the semiconductor substrate 1. Thus, the interconnection layer 41 can be greater in width compared to the interconnection layer in the case where the word line is formed on the semiconductor substrate 1.

The interconnection layer forming process may be followed by a process of forming a capacitor connected to the MOS transistor Tr, thereby efficiently forming a DRAM.

While the present embodiment describes that the first conductivity type is the p-type and the second conductivity type is the n-type, the first conductive type may be the n-type and the second conductivity type may be the p-type.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A method of forming a semiconductor device, the method comprising:
    introducing a first impurity into a semiconductor substrate to form a first well including a memory cell region;
    forming a semiconductor layer over the semiconductor substrate;
    introducing a second impurity into the semiconductor substrate through the semiconductor layer using a first mask to form a second well including a first peripheral circuit region, the second well being adjacent to the first well; and
    introducing a third impurity into the semiconductor layer over the second well using the first mask to form the first impurity-introduced region.

2. The method according to claim 1, further comprising:
    selectively removing the first impurity-introduced region to form a wiring over the second well after introducing the third impurity.

3. The method according to claim 1, further comprising:
    introducing a fourth impurity into the semiconductor substrate through the semiconductor layer using a second mask to form a third well in a second peripheral circuit region in the semiconductor substrate after introducing the third impurity.

4. The method according to claim 1, further comprising:
    forming a transistor in the first well before introducing the second impurity.

5. The method according to claim 3, further comprising:
    introducing a fifth impurity into the semiconductor layer which is disposed over the third well using the second mask after introducing the fourth impurity.

6. A method comprising:
    forming a polycrystalline semiconductor layer over a semiconductor substrate;
    introducing a first impurity into the semiconductor substrate through at least one portion of the polycrystalline semiconductor layer to form a first well region in the semiconductor substrate, the first impurity representing a first conductivity type so that the first well region represents the first conductivity type;
    introducing, after introducing the first impurity, a second impurity into the at least one portion of the polycrystalline semiconductor layer, the second impurity representing a second conductivity type so that the at least one portion of the polycrystalline semiconductor layer represents the second conductivity type;
    introducing a third impurity into the semiconductor substrate through at least another portion of the polycrystalline semiconductor layer to form a second well region in the semiconductor substrate, the third impurity representing the second conductivity type so that the second well region represents the second conductivity type; and
    introducing, after introducing the third impurity, a fourth impurity into the at least another portion of the polycrystalline semiconductor layer, the fourth impurity representing the first conductivity type so that the at least another portion of the polycrystalline semiconductor layer represents the first conductivity type.

7. The method as claimed in claim 6, wherein the introducing the third impurity is performed after the introducing the second impurity.

8. The method as claimed in claim 7,
    wherein the introducing the third impurity comprises:
    forming a second mask layer over the polycrystalline semiconductor layer to define the at least another portion of the polycrystalline semiconductor layer, and
    selectively doping the third impurity into the semiconductor substrate by using the second mask layer; and
    wherein the introducing the fourth impurity comprises:
    selectively doping the fourth impurity into the at least another portion of the polycrystalline semiconductor layer while leaving the second mask layer.

9. The method as claimed in claim 8, further comprising patterning each of the at least one portion and the at least another portion of the polycrystalline semiconductor layer to provide first and second patterned polycrystalline semiconductor portions that are different in conductivity type from each other, forming first source and drain regions that cooperate with the first patterned polycrystalline semiconductor portion to serve as a first transistor of a first channel type, and forming second source and drain regions that cooperate with the second patterned polycrystalline semiconductor portion to serve as a second transistor of a second channel type.

10. A method comprising:
selectively forming a first well in a memory cell region of a semiconductor substrate;
selectively forming a trench in the first well;
burying a conductive layer in the trench with an intervention of a gate insulating film between the conductive layer and the first well and with a cap insulating film over the conductive layer; and
selectively forming, after burying the conductive layer, a second well in a peripheral region of the semiconductor substrate.

11. The method as claimed in claim 10, wherein the first well is different in conductivity type from the second well.

12. The method as claimed in claim 10, further comprising selectively forming, after selectively forming the second well, a third well in the peripheral region of the semiconductor substrate.

13. The method as claimed in claim 10, further comprising:
selectively forming first and second diffusion layers in the first well, the first and second diffusion layers cooperating with the conductive layer to serve as a transistor;
forming an insulating layer over the first and second diffusion layers and the cap insulating film;
selectively forming a hole in the insulating layer to expose a part of the first diffusion layer;
forming a polycrystalline semiconductor layer over the insulating layer with filling the hole; and
patterning the polycrystalline semiconductor layer to form first and second polycrystalline semiconductor interconnection lines, the first polycrystalline semiconductor interconnection line being formed over the memory cell region in contact with the part of the first diffusion layer through the hole, and the second polycrystalline semiconductor interconnection line being formed over the peripheral region.

14. The method as claimed in claim 11, wherein the first well is equal in conductivity type to the second well.

15. The method as claimed in claim 12, wherein the first well is of a first conductivity type, the second well is of one of the first conductivity and a second conductivity type, and the third well is of the other of the first and second conductivity types.

16. The method as claimed in claim 13, wherein the selectively forming the second well comprises introducing a first impurity into the peripheral region through a part of the polycrystalline semiconductor layer; and the part of the polycrystalline semiconductor layer is converted into the second polycrystalline semiconductor interconnection line by patterning the polycrystalline semiconductor layer.

17. The method as claimed in claim 16, wherein further comprising introducing a second impurity into the part of the polycrystalline semiconductor layer, the first and second impurity being different in conductivity type from each other so that the first well and the part of the polycrystalline semiconductor layer are different in conductivity type from each other.

* * * * *